(12) United States Patent
Yee

(10) Patent No.: US 11,540,034 B2
(45) Date of Patent: Dec. 27, 2022

(54) MESH ASSEMBLY AND DISPLAY MODULE INCLUDING THE SAME

(71) Applicant: Samsung Display Co., Ltd., Yongin-si (KR)

(72) Inventor: Dong-Su Yee, Cheonan-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 564 days.

(21) Appl. No.: 16/598,951

(22) Filed: Oct. 10, 2019

(65) Prior Publication Data

US 2020/0137471 A1 Apr. 30, 2020

(30) Foreign Application Priority Data

Oct. 31, 2018 (KR) .................. 10-2018-0132037

(51) Int. Cl.
| | |
|---|---|
| *H04R 25/00* | (2006.01) |
| *H04R 1/02* | (2006.01) |
| *H05K 5/00* | (2006.01) |
| *H04R 1/08* | (2006.01) |
| *H05K 5/03* | (2006.01) |
| *H04M 1/02* | (2006.01) |
| *H05K 5/02* | (2006.01) |

(52) U.S. Cl.
CPC .......... *H04R 1/023* (2013.01); *H04M 1/0266* (2013.01); *H04R 1/086* (2013.01); *H05K 5/0017* (2013.01); *H05K 5/0217* (2013.01); *H05K 5/03* (2013.01)

(58) Field of Classification Search
CPC ...... H04R 1/023; H04R 1/086; H04R 25/654; H04R 2499/11; H04R 1/026; H04R 2499/15; G06F 1/1626; G06F 1/1656; G06F 1/1688
See application file for complete search history.

(56) References Cited

U.S. PATENT DOCUMENTS 9,538,272 B2 * 1/2017 Auclair .................. H04R 1/023

FOREIGN PATENT DOCUMENTS

| JP | 2006-140092 A | 6/2006 |
|---|---|---|
| KR | 10-2005-0079202 A | 8/2005 |
| KR | 10-1455076 B1 | 10/2014 |
| KR | 10-2015-0004349 A | 1/2015 |
| WO | WO 2013/160234 A1 | 10/2013 |

OTHER PUBLICATIONS

Shang, Jianhui et al., "Hemming of Aluminum Alloy Sheets Using Electromagnetic Forming", Journal of Materials Engineering and Performance; 20(8); Jul. 12, 2011; pp. 1370-1377.

* cited by examiner

*Primary Examiner* — Amir H Etesam
(74) *Attorney, Agent, or Firm* — Lewis Roca Rothgerber Christie LLP

(57) ABSTRACT

A mesh assembly includes a mesh cover, and a stiffener configured to fix a position of the mesh cover, wherein the stiffener includes a body and an arm extending from the body, and wherein the arm includes a bending portion having an internal diameter of about 0.3 mm or more.

20 Claims, 10 Drawing Sheets

MESH ASSEMBLY AND DISPLAY MODULE INCLUDING THE SAME

CROSS-REFERENCE TO RELATED APPLICATION

This application claims priority to and the benefit of Korean Patent Application No. 10-2018-0132037, filed in the Korean Intellectual Property Office on Oct. 31, 2018, the entire content of which is incorporated herein by reference.

BACKGROUND

1. Field

Aspects of the disclosure relate to a mesh assembly, a display module that includes the mesh assembly, and an electronic device including the display module.

2. Description of the Related Art

Acoustic devices such as speakers or microphones are commonly provided in electronic devices, such as smart phones. An electronic device may include an aperture at a location corresponding to the acoustic device for smooth acoustic connection into and out of the electronic device. A mesh cover through which sound can pass is provided in the aperture to protect internal parts such as an acoustic element, while providing an aesthetic appearance.

The mesh cover can be exposed to the outside of the electronic device through an aperture of a window, and static electricity and/or the like may be introduced into the electronic device through the mesh cover. In order to protect the electronic device from static electricity, particularly, protect parts that are susceptible to damage from static electricity, a stiffener that fixes the mesh cover may include a structure for grounding.

The above information disclosed in this Background section is only for enhancement of understanding of the background and therefore it may contain information that does not form the prior art that is already known in this country to a person of ordinary skill in the art.

SUMMARY

Aspects of embodiments of the inventive concept are directed to a mesh assembly having improved reliability, a display module including the same, and an electronic device including the display module. According to some embodiments, the mesh assembly is used to protect an acoustic device in the electronic device.

According to some embodiments of the inventive concept, there is provided a mesh assembly including: a mesh cover; and a stiffener configured to fix a position of the mesh cover, wherein the stiffener includes a body and an arm extending from the body, and wherein the arm includes a bending portion having an internal diameter of about 0.3 mm or more.

In some embodiments, the stiffener includes a plate having a thickness of about 0.2 mm or less.

In some embodiments, the arm includes a folded structure by virtue of the bending portion.

In some embodiments, the arm includes a first portion extending in a second direction from the body, a second portion extending in a first direction from the first portion, a third portion extending in an opposite direction of the second direction from the second portion, and a contact portion extending in the opposite direction of the second direction from the third portion.

In some embodiments, the bending portion is between the first portion and the second portion, and the first portion and the second portion overlap with each other in a third direction crossing the first and second directions.

In some embodiments, the bending portion protrudes in an opposite direction of the third direction from the first portion.

In some embodiments, the bending portion protrudes in the third direction and from the second portion.

In some embodiments, the bending portion is between the second portion and the third portion, and the second portion and the third portion overlap with each other in the third direction.

In some embodiments, the bending portion protrudes in an opposite direction of the third direction from the third portion.

In some embodiments, the bending portion protrudes in the third direction and from the second portion.

In some embodiments, the arm further includes a step generating portion between the third portion and the contact portion.

In some embodiments, the stiffener includes a protrusion protruding from the body, and the mesh cover covers at least a part of the protrusion.

According to some embodiments of the inventive concept, there is provided a display module including: a window having an opening; a display panel at a rear side of the window; and a mesh assembly at the rear side of the window and overlapping with the opening, the mesh assembly including a mesh cover; a stiffener configured to fix a position of the mesh cover, wherein the stiffener includes a body and an arm extending from the body, and wherein the arm includes a bending portion having an internal diameter of about 0.3 mm or more.

In some embodiments, the stiffener includes a plate having a thickness of about 0.2 mm or less.

In some embodiments, the arm includes a first portion extending in a second direction from the body, a second portion extending in a first direction from the first portion, a third portion extending in an opposite direction of the second direction from the second portion, and a contact portion extending in the opposite direction of the second direction from the third portion.

In some embodiments, the bending portion is between the first portion and the second portion, and the first portion and the second portion overlap with each other in a third direction crossing the first and second directions.

In some embodiments, the bending portion protrudes in an opposite direction of the third direction from the first portion.

In some embodiments, the bending portion is between the second portion and the third portion, and the second portion and the third portion overlap with each other in the third direction.

In some embodiments, the bending portion protrudes in an opposite direction of the third direction from the third portion.

In some embodiments, the stiffener includes a protrusion protruding from the body, the mesh cover covers at least a part of the protrusion, and the protrusion and at least a part of the mesh cover are in the opening.

According to some embodiments, generation of cracks in the arm of the stiffener, which is a structure for grounding in the mesh assembly applied to an electronic device, can be prevented or substantially prevented, and accordingly, occurrence of a defect in the electronic device can be reduced.

DETAILED DESCRIPTION

Figure 1:
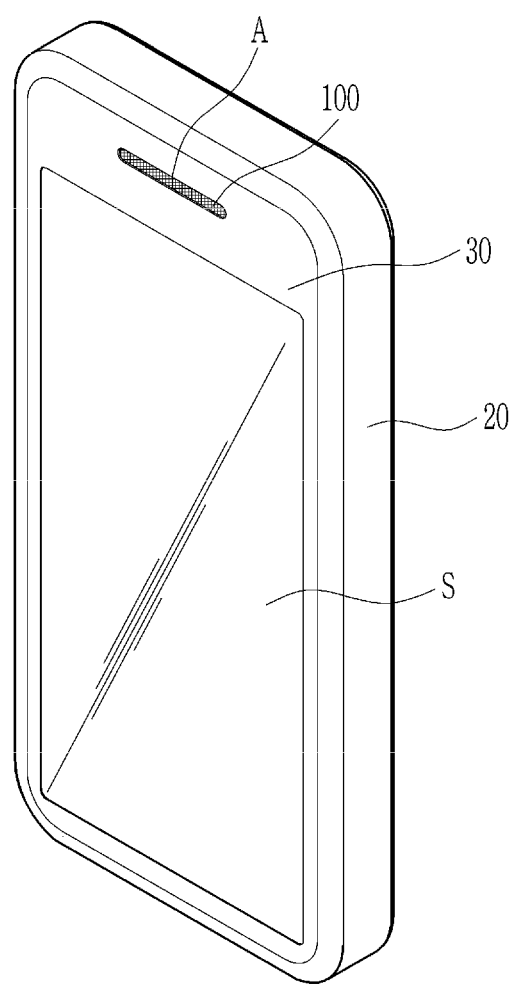
FIG. 1 schematically shows an electronic device to which a mesh assembly according to an embodiment is applied.

Hereinafter, embodiments of the inventive concept will be described in more detail with reference to the accompanying drawings. As those skilled in the art would realize, the described embodiments may be modified in various suitable ways, all without departing from the spirit or scope of the inventive concept.

Same reference numerals designate same elements throughout the specification. The thicknesses and sizes of the layers and regions in the drawings may be shown as enlarged or reduced to clearly show their placement and relative position.

Hereinafter, a mesh assembly, a display module including the mesh assembly, and an electronic device including the display module according to embodiments will be described with reference to the accompanying drawings. An electronic device to which a mesh assembly and a display module are coupled, according to an embodiment, will now be described, and then mesh assemblies according to some embodiments will be described.

Figure 2:
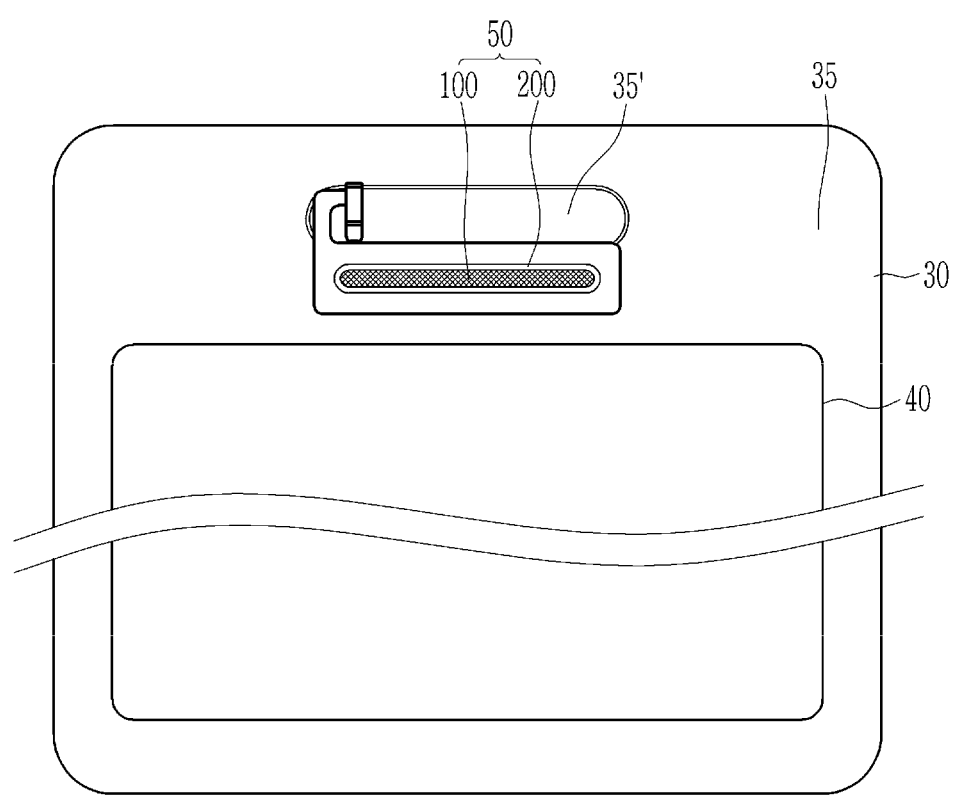
FIG. 2 shows a rear side of a display module to which the mesh assembly according to the embodiment is applied.

FIG. 1 schematically shows an electronic device 10 to which a mesh assembly 50 is applied according to an embodiment, and FIG. 2 shows a rear side of a display module DM to which the mesh assembly 50 according to the embodiment is applied. In order to more accurately display a location of the mesh assembly 50, FIG. 2 shows a rear side of the display module DM, which is a constituent element of the electronic device 10, rather than displaying the rear side of the electronic device 10.

Referring to FIG. 1 and FIG. 2, the electronic device 10 may be a mobile device, such as a smart phone, having a screen S. The electronic device 10 includes a housing 20 and a window 30 that provide an external surface of the electronic device 10. The housing 20 may be referred to as set frame. Several parts that form the electronic device 10 are located in an internal space set by the housing 20 and the window 30. For example, a display panel 40, the mesh assembly 50, a driving circuit, a camera, a speaker, a microphone, a receiver, a communication module, various suitable sensors, a processor, a memory, a battery, and/or the like may be disposed in the electronic device 10.

A front side of the electronic device 10 may be almost completely occupied by the screen S where an image is displayed. Since an image displayed by the display panel 40 is transmitted to a user through the window 30, the screen S may correspond to a surface of the window 30. The window 30 may be formed of a transparent and hard material such as glass, plastic, and/or the like, and may have a set or predetermined thickness. A functional layer such as a contamination prevention layer, an anti-reflection layer, a hard coating layer, and/or the like may be applied to the surface of the window 30.

The electronic device 10 includes a speaker such that a user can hear sound (e.g., voice) provided by an other party during a call. The sound (i.e., the sound wave) generated by the speaker may be blocked by the window 30, and thus, may hardly be transmitted to the outside the electronic device 10. Accordingly, the window 30 includes an opening A through which the sound can be transmitted. However, since foreign matter (e.g., dust, water, and/or the like) may be permeated into the electronic device 10 through the opening A, the opening A is covered by the mesh cover 100 that can effectively prevent or substantially prevent permeation of the foreign matter while allowing the sound to pass through the opening A.

The mesh cover 100 may be provided in the form of the mesh assembly 50. The mesh assembly 50 includes the mesh cover 100 and a stiffener 200 that fixes and supports the mesh cover 100. The mesh cover 100 may be formed of a metal or a metal alloy, which is a material that is difficult to damage or deform by impact, while providing excellent processability. The stiffener 200 may be formed of a metal or a metal alloy having excellent processability. The stiffener 200 may be, for example, formed of stainless steel, aluminum, and/or the like. The stiffener 200 may be formed by processing a plate of thin thickness, for example, about 0.2 mm or less, about 0.15 mm or less, about 0.1 mm or less, or about 0.1 mm to about 0.15 mm.

Referring to FIG. 2, the display panel 40 is disposed in the rear side of the window 30. The display panel 40 may be attached to the window 30. Herein, a combination of the window 30 and the display panel 40 may be referred to as a display module DM. A print layer 35 is disposed in a portion of the rear side of the window 30, which does not overlap with the display panel 40. The print layer 35 functions to hide portions of the window 30, excluding the screen S. Light cannot be transmitted through almost the entire area of the print layer 35, but the print layer 35 may include a semitransparent print layer 35' disposed at a set or predetermined area, for example, an area adjacent to the mesh assembly 50. The semitransparent print layer 35' may correspond to a location of the sensor and/or the like in the electronic device 10. The semitransparent print layer 35' enables the sensor and/or the like to sense an external condition (e.g., illumination, a distance to an object, and/or the like) while preventing the sensor and/or the like of the electronic device 10 from being seen from the outside.

The display panel 40 serves to display an image in the electronic device 10, and may have a structure in which pixels are arranged on a substrate. The pixels may be formed of, for example, light emitting elements such as organic light emitting diodes, and the display panel 40 may be provided as an organic light emitting display panel where circuit elements and organic light emitting elements are formed on the substrate. In some examples, the display panel 40 may be provided as a liquid crystal display where circuit elements and a liquid crystal layer are formed between two substrates. The display panel 40 may include an anti-reflection layer at a surface that faces the window 30, and may include a functional layer such as a cushion layer, a black layer, and/or the like at the opposite surface.

The mesh assembly 50 is also disposed at the rear side of the window 30. The mesh assembly 50 is disposed corresponding to the opening A of the window 30. A part of the mesh assembly 50 may be disposed inside the opening A of the window 30. For example, the mesh assembly 50 may include a protrusion, which may be inserted into the opening A of the window 30. Static electricity may be introduced into the electronic device 10 through the mesh assembly 50 from the outside due to the opening A of the window 30. In order to dissipate the introduced static electricity, the stiffener 200 may be grounded to a frame provided inside the electronic device 10, and the stiffener 200 includes a structure for grounding and this will be described later.

Hereinafter, the mesh assembly 50 will be described in detail with reference to FIG. 3 to FIG. 6. Reference may also be made to FIG. 1 and FIG. 2 without any special mention in order to explain their relevance to other components.

Figure 3:
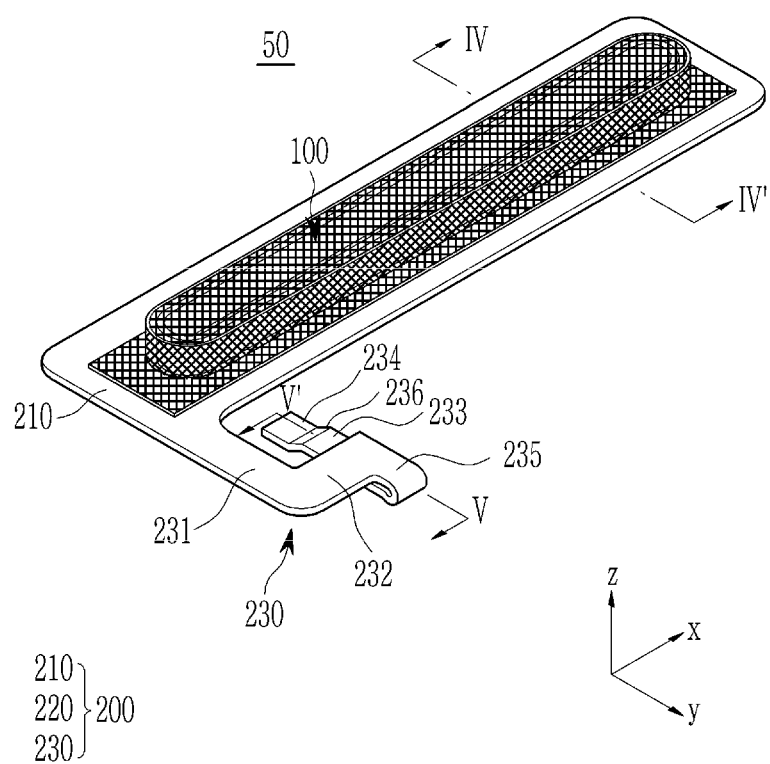
FIG. 3 is a perspective view of a mesh assembly according to an embodiment.
Figure 4:
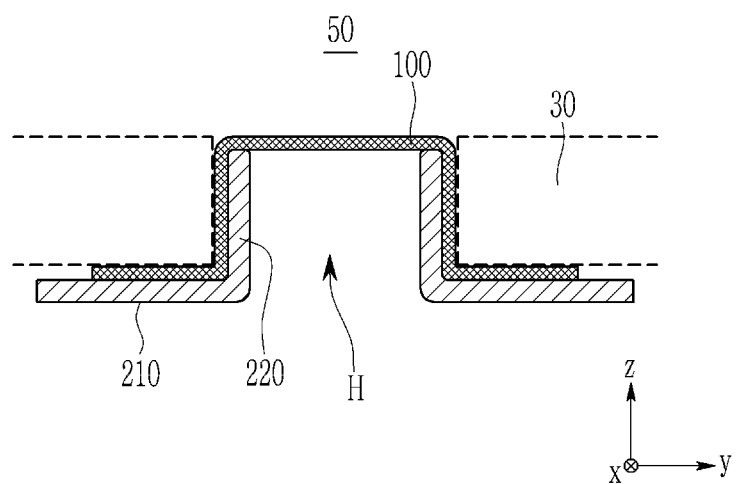
FIG. 4 shows an embodiment of a cross-section of FIG. 3, taken along the line IV-IV'.
Figure 5:
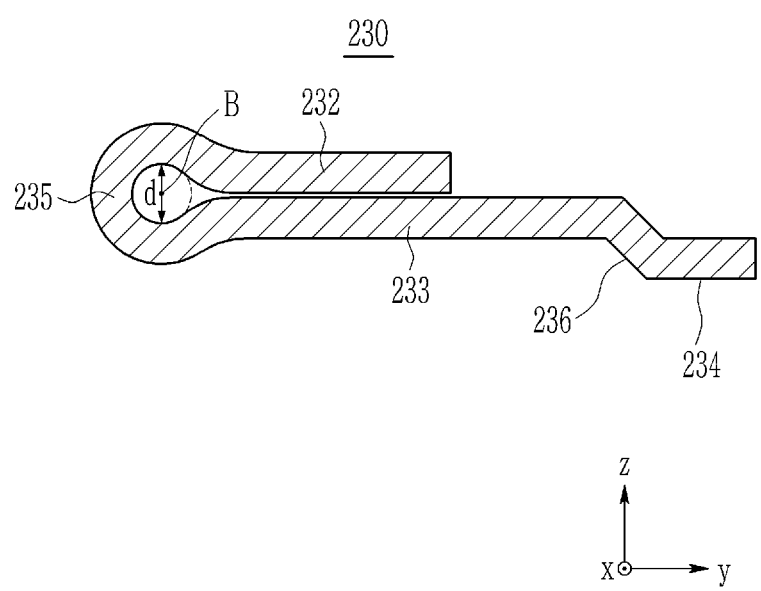
FIG. 5 and FIG. 6 show embodiments of the cross-section of FIG. 3, taken along the line V-V'.
Figure 6:
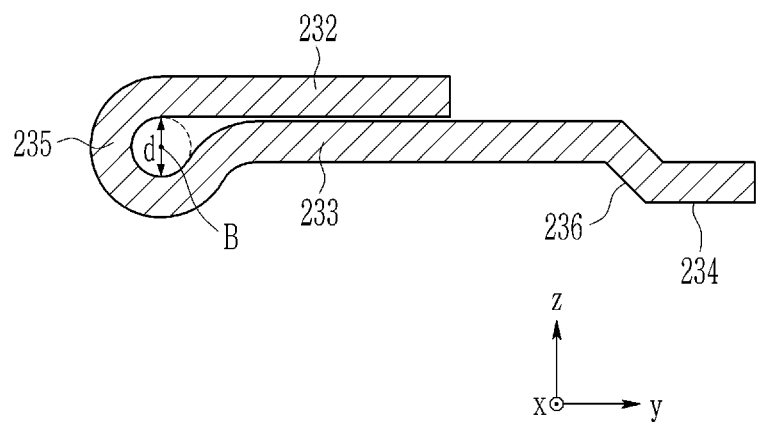

FIG. 3 is a perspective view of the mesh assembly according to an embodiment; FIG. 4 shows an embodiment of the cross-section of the mesh assembly of FIG. 3, taken along the line IV-IV'; and FIG. 5 and FIG. 6 illustrate cross-sections of the mesh assembly of FIG. 3, taken along the line V-V', according to some embodiments.

Referring to FIG. 3 and FIG. 4, the mesh assembly 50 includes the mesh cover 100 and the stiffener 200. The mesh cover 100 is disposed on the stiffener 200, and the mesh cover 100 is disposed between the window 30 and the stiffener 200 in the electronic device 10. For better understanding and convenience of description, a state in which the mesh assembly 50 is assembled to the window 30 is indicated by dotted lines.

The stiffener 200 includes a body 210, a protrusion 220 protruding from the body 210, and an arm 230 extended from the body 210. The body 210 may be provided as a flat plate that extends substantially in a first direction x, and a hole H is formed along the first direction x in the body 210. Thus, the body 210 may be formed in the shape of a substantially long and flat ring. The protrusion 220 extends substantially in the first direction x, and may protrude in a third direction z. The hole H of the stiffener 200 may be limited by the protrusion 220, and the protrusion 220 may be formed in the shape of a ring that is substantially long and has a set or predetermined height. The hole H and the protrusion 220 may be formed to match the opening A of the window 30. A height of the protrusion 220 may be similar to or approximately the same as a thickness of the periphery of the opening A of the window 30.

The mesh cover 100 is three-dimensionally formed to match the shape of the protrusion 220 while covering at least a part of the protrusion 220. In the illustrated embodiment, the mesh cover 100 completely covers the protrusion 220, while partially covering the body 210. The hole H of the stiffener 200 is covered by the mesh cover 100.

Due to such a structure, the mesh cover 100 can be closely attached between the internal surface of the opening A of the window 30 and the external surface of the protrusion 220 of the stiffener 200. In some examples, the mesh assembly 50 may be fixed to the window by an additional attachment means. The mesh cover 100 may not be disposed in the opening A even through it overlaps with the opening A.

The arm 230 of the stiffener 200 is provided to ground the mesh assembly 50. The arm 230 may include a first portion 231 extending in a second direction y from the body 210, a second portion 232 extending in the first direction x from the first portion 231, and a third portion 233 extending in a direction opposite to the second direction y from the second portion 232. The arm 230 may include a contact portion 234 that extends in a direction opposite to the second direction y from the third portion 233. The contact portion 234 is a portion that contacts a structure provided for grounding, such as a frame. The contact portion 234 may be disposed at an end portion of the arm 230.

Since the second portion 232 and the third portion 233 extend in opposite directions, the arm 230 includes a bending portion 235 provided between the second portion 232 and the third portion 233. Thus, the arm 230 has a folded structure of approximately 180° by virtue of the bending portion 235, and the second portion 232 and the third portion 233 face each other while overlapping in the third direction z. The arm 230 extends in various suitable directions, and includes the bending portion 235 to contact the grounding structure while avoiding interference with other parts that may be disposed around the stiffener 200, such as sensors, cameras, and/or the like. However, the arm 230 may include portions that extend in one direction (e.g., the second direction y) and the opposite direction, and a bending portion disposed between the portions, or may include portions extending in further directions.

The arm 230 may include at least one step generating portion 236. In the illustrated embodiment, the step generating portion 236 is disposed between the third portion 233 and the contact portion 234. Due to the step generating portion 236, the contact portion 234 may protrude more in the opposite direction of the third direction z than the third portion 233, and the contact portion 234 may (desirably) be in contact with the grounding structure and may maintain such a contact. The step generating portion 236 may be bent substantially in the third direction z from the contact portion 234, or may be obliquely bent (e.g., bent at an angle relative to, and not perpendicular or parallel to, the contact portion 234).

Bending of the arm 230 may be carried out through a press process, and when the arm 230 is bent, a high compression stress is applied to the inside of the bending portion 235 and a high tension force is applied to the outer side of the bending portion 235 such that a crack may be generated in the bending portion 235. In a typical press process, the bending portion 235 may be bent until a curvature radius becomes close to zero, and accordingly possibility of generation of the crack is high. The crack is difficult to identify through visual inspection, and a test through physical contact is difficult to carry out. Thus, despite a crack occurring, the mesh assembly 50 may be applied to a product such as the electronic device 10. In such a case, an impact on the electronic device 10 may deepen the crack, breaking the arm 230, and causing a part (e.g., the third portion 233 and the contact portion 234) of the arm 230 to fall off. In particular, when the stiffener 200 is formed or a metal plate having a thickness of about 0.2 mm or less, a rupture due to cracks may occur.

In order to suppress generation of cracks in the bending portion 235, the bending portion 235 may have an internal diameter d that is equal to or larger than a set or predetermined value. For example, the internal diameter d of the bending portion 235 may be at least about 0.3 mm, at least about 0.4 mm, or at least about 0.5 mm. The internal diameter d may correspond to a maximum distance between internal surfaces of the bending portion 235 that face each other in the third direction z. As described, the compression stress inside the bending portion 235 and the tension stress at the outer side of the bending portion 235 can be reduced by forming the bending portion 235, and thus possibility of generation of cracks can be reduced. For example, when the bending portion 235 is formed of about 0.1 mm-thick stainless steel, generation of cracks can be prevented substantially reduced if the internal diameter d of the bending portion 235 is about 0.3 mm or more. It may be desirable to prevent the generation of the cracks in the bending portion 235 by increasing the internal diameter d. However, the larger the internal diameter d, the greater the thickness of the bending portion 235. Accordingly, the internal diameter d of the bending portion 235 may be limited depending on a design margin allocated to the stiffener 200.

The bending portion 235 having the internal diameter d with a set or predetermined value may be formed by inserting and securing a pin having high hardness in an area to be bent in the arm 230, followed by a press process. Hardness of the pin needs to be higher than that of at least the arm 230 so that the bending portion 235 can be formed to match the surface of the pin without deforming the pin during the press process. The pin used in this case may be a cylinder type having a length that is longer than a width of the bending portion 235. The internal diameter d of the bending portion 235 may be equal to or similar to a diameter of the pin.

The shape of a bending portion 235 according to an embodiment shown in FIG. 5 and the shape of a bending portion 235 according to an embodiment shown in FIG. 6 are slightly different from each other. In FIG. 5, a bending axis B that is approximately parallel with the first direction x is disposed on extension lines of surfaces of the second portion 232 and the third portion 233, facing each other, substantially in the second direction y. In the bending portion 235 of FIG. 6, a bending axis B that is approximately parallel with the first direction x is disposed at a distance from extension lines of surfaces of the second portion 232 and the third portion 233, facing each other, substantially in the second direction y. Accordingly, the bending portion 235 of FIG. 5 may protrude in the third direction z and the opposite direction, that is, the bending portion 235 may be approximately symmetrically or asymmetrically protruded from the second portion 232 and the third portion 233. The bending portion 235 of FIG. 6 may protrude in the opposite direction to the third direction z and only from the third portion 233, and does not protrude from the second portion 232. In the bending portion 235 of FIG. 6, may be desirable to prevent the print layer 35 from being damaged due to the bending portion 235 because the possibility of contacting the print layer 35 or pressing against the print layer 35 is low.

As described, the bending axis B of the bending portion 235 may be variously changed in design, as appropriate, and may be variously applied depending on a design rule of the electronic device 10. In any case, the bending portion 235 may be formed with a set or predetermined inner diameter, for example, about 0.3 mm or more, so that generation of cracks can be suppressed or substantially reduced.

Hereinafter, differences with the above-described embodiments will be mainly described with reference to FIG. 7 to FIG. 9.

Figure 7:
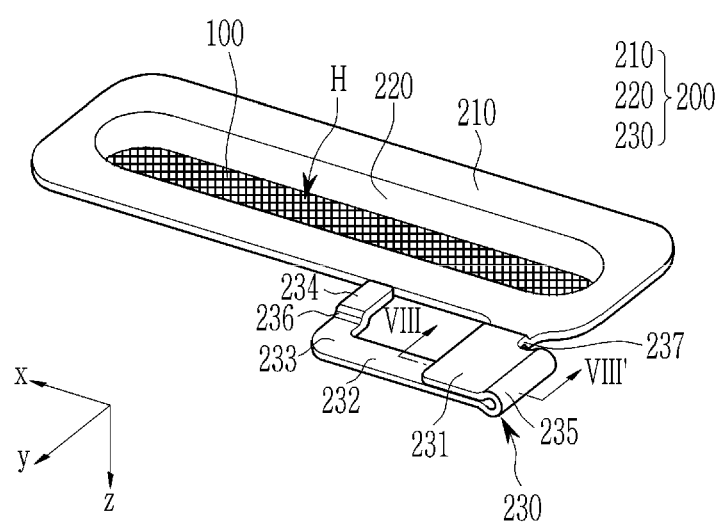
FIG. 7 is a perspective view of a mesh assembly according to an embodiment.
Figure 8:
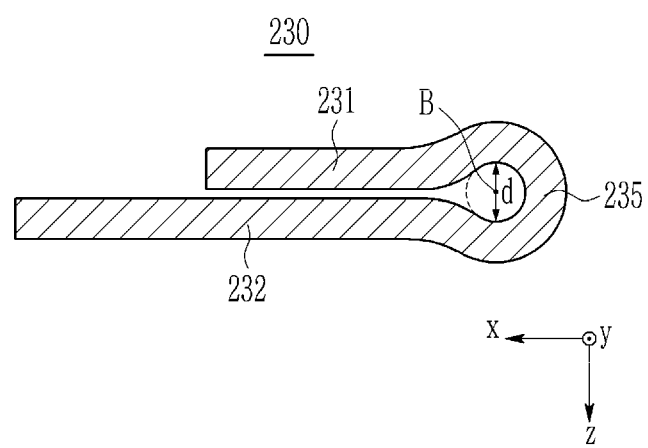
FIGS. 8-9 are embodiments of a cross-section of FIG. 7, taken along the line VIII-VIII'.
Figure 9:
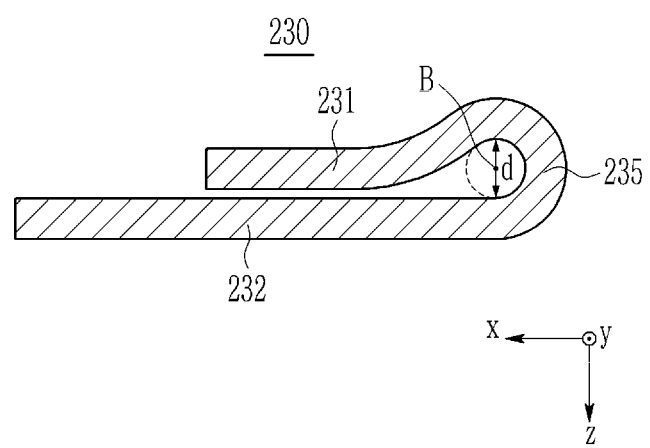

FIG. 7 is a perspective view of a mesh assembly 50 according to an embodiment, and FIG. 8 and FIG. 9 are embodiments of the cross-section of the mesh assembly of FIG. 7, taken along the line VIII-VIII'.

Referring to FIG. 7, a mesh assembly 50 of the present embodiment is similar to the mesh assembly shown in FIG. 3, except for a shape of an arm 230 of a stiffener 200. For example, an arm 230 provided for grounding the mesh assembly 50 may include a first portion 231 extending in the second direction y from a body 210, a second portion 232 extending in the first direction x from the first portion 231, and a third portion 233 extending in the opposite direction of the second direction y from the second portion 232. The arm 230 may include a contact portion 234 that extends in the opposite direction of the second direction y from the third portion 233. The contact portion 234 is a portion that contacts a structure for grounding, such as a frame.

The arm 230 includes a bending portion 235 between the first portion 231 and the second portion 232. The arm 230 has an approximately 180° folded structure by virtue of the bending portion 235, a bending axis B of which is approximately parallel with the second direction y, and the first portion 231 and the second portion 232 face each other, while overlapping in the third direction z.

The arm 230 may include at least one of step generating portions 236 and 237. In the shown embodiment, the step generating portion 236 is disposed between the third portion 233 and the contact portion 234, and the step generating portion 237 is disposed between the body 210 and the first portion 231 of the arm 230. Due to the existence of the step generating portion 236, the contact portion 234 may protrude more in the opposite direction of the third direction z than the third portion 233, and the contact portion 234 may be desirable for making contact with a grounding structure or for maintaining such contact. The step generating portion 237 lowers the possibility of the arm 230 contacting the print layer 35 or pressing against the print layer 35, and accordingly, the print layer 35 can be prevented from being damaged by the arm 230 or damage thereto may be substantially reduced. The step generating portion 236 may be bent toward the third direction z (or bent about the first direction x) from the contact portion 234, and may be obliquely bent (e.g., be bent at an oblique angle relative to, and not perpendicular or parallel to, the contact portion 234). The step generating portion 237 may be bent about the third direction z from the first portion 231, and may be obliquely bent (e.g., be bent at an oblique angle relative to, and not perpendicular or parallel to, the first portion 231).

As previously described with respect to the embodiments of FIG. 2 to FIG. 6, bending of the arm 230 may be carried by a press process, and when the arm 230 is bent, a high compression stress is applied to the inside of the bending portion 235 and a high tension stress is applied to the outer side of the bending portion 235 such that cracks may be generated in the bending portion 235. In the present embodiment, the bending portion 235 may have an internal diameter d of over a set or predetermined value in order to suppress generation of cracks in the bending portion 235. For example, the internal diameter d of the bending portion 235 may be at least about 0.3 mm, at least about 0.4 mm, or as least about 0.5 mm. As described, when such a bending portion 235 is formed, the compression stress applied to the inside of the bending portion 235 and the extension stress applied to the outer side of the bending portion 235 can be reduced, thereby suppressing generation of cracks. The internal diameter d of the bending portion 235 may be limited by a design margin allocated to a stiffener 200 that includes the bending portion 235.

A shape of the bending portion 235 according to the embodiment shown in FIG. 8 is different from a shape of the bending portion 235 according to the embodiment shown in FIG. 9. In the bending portion 235 of FIG. 8, a bending axis B that is approximately parallel with the second direction y is disposed at extension lines in the first direction x of surfaces of the first portion 231 and the second portion 232, facing each other. In the bending portion 235 of FIG. 9, a bending axis B that is approximately parallel with the second direction y is disposed at a distance from extension lines in the first direction x of surfaces of the first portion 231 and the second portion 232, facing each other. Accordingly, the bending portion 235 of FIG. 8 may protrude in the third direction z and the opposite direction of the third direction z, and for example, may protrude approximately symmetrically or asymmetrically from the first portion 231 and the second portion 232. The bending portion 235 of FIG. 9 does not protrude in the third direction z from the second portion 232, and may protrude in the opposite direction of the third direction z only from an outer surface of the first portion 231. A technical significance of such a bending portion 235 has already been described with reference to the embodiments of FIG. 5 and FIG. 6, and therefore no further description will be provided.

Figure 10:
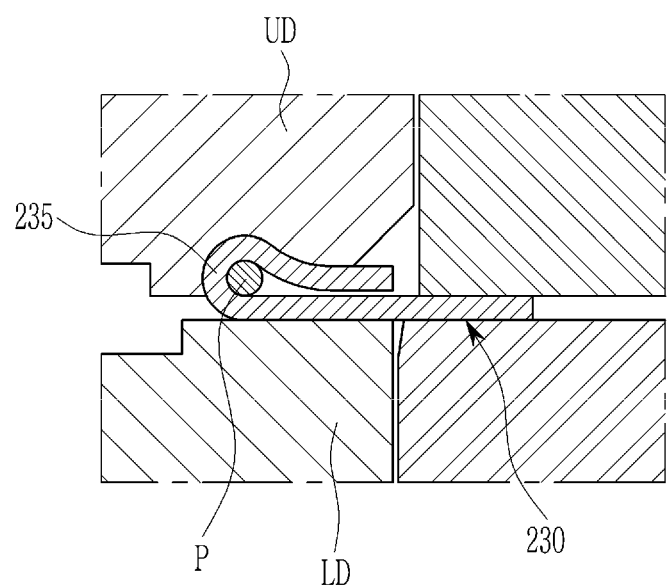
FIG. 10 schematically shows a method for forming a bending portion in an arm of a stiffener according to an embodiment.

FIG. 10 schematically shows a method for forming a bending portion 235 in an arm of a stiffener according to an embodiment.

Bending of an arm 230 may be carried out by a progressive press process. After a pin P is fixed to an area of the arm 230 that is to be bent, the progress press process is carried out such that a bending portion 235 having an internal diameter that corresponds to an external diameter of the pin P can be formed. In order to prevent or substantially prevent the pin P from being deformed during the press process, the pin P needs high hardness, and the hardness of the pin P is preferably higher than the hardness of at least the arm 230. In addition, a groove that matches an external diameter of the bending portion 235 needs to be formed in at least one of a bottom surface of an upper mold UD and a top surface of a lower mold LD such that the bending portion 235 can have a set or predetermined internal diameter without being pressed or being reduced in thickness.

The phrase a "cross-section" may refer to a cross-section formed by vertically cutting a target portion from the side.

In the drawings, the symbol x used in indication of a direction is a first direction, the symbol y indicates a second direction that is perpendicular to the first direction, and the symbol z indicates a third direction that is perpendicular to the first direction and the second direction.

It will be understood that, although the terms "first", "second", "third", etc., may be used herein to describe various elements, components, regions, layers and/or sections, these elements, components, regions, layers and/or sections should not be limited by these terms. These terms are used to distinguish one element, component, region, layer or section from another element, component, region, layer or section. Thus, a first element, component, region, layer or section discussed below could be termed a second element, component, region, layer or section, without departing from the spirit and scope of the inventive concept.

Spatially relative terms, such as "lower", "upper", and the like, may be used herein for ease of description to describe one element or feature's relationship to another element(s) or feature(s) as illustrated in the figures. It will be understood that the spatially relative terms are intended to encompass different orientations of the device in use or in operation, in addition to the orientation depicted in the figures. In addition, it will also be understood that when a layer is referred to as being "between" two layers, it can be the only layer between the two layers, or one or more intervening layers may also be present.

The terminology used herein is for the purpose of describing particular embodiments and is not intended to be limiting of the inventive concept. As used herein, the singular forms "a" and "an" are intended to include the plural forms as well, unless the context clearly indicates otherwise. It will be further understood that the terms "include," "including," "comprises," and/or "comprising," when used in this specification, specify the presence of stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items.

For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ.

Further, the use of "may" when describing embodiments of the inventive concept refers to "one or more embodiments of the inventive concept." Also, the term "exemplary" is intended to refer to an example or illustration.

It will be understood that when an element or layer is referred to as being "on", "connected to", "coupled to", or "adjacent" another element or layer, it can be directly on, connected to, coupled to, or adjacent the other element or layer, or one or more intervening elements or layers may be present. When an element or layer is referred to as being "directly on," "directly connected to", "directly coupled to", or "immediately adjacent" another element or layer, there are no intervening elements or layers present.

As used herein, the term "substantially," "about," and similar terms are used as terms of approximation and not as terms of degree, and are intended to account for the inherent variations in measured or calculated values that would be recognized by those of ordinary skill in the art. Further, a specific quantity or range recited in this written description or the claims may also encompass the inherent variations in measured or calculated values that would be recognized by those of ordinary skill in the art.

As used herein, the terms "use," "using," and "used" may be considered synonymous with the terms "utilize," "utilizing," and "utilized," respectively. While the inventive concept has been described in connection with what is presently considered to be practical embodiments, it is to be understood that the inventive concept is not limited to the disclosed embodiments. On the contrary, it is intended to cover various suitable modifications and equivalent arrangements included within the spirit and scope of the inventive concept as defined by the appended claims and equivalents thereof.

What is claimed is:

1. A mesh assembly comprising:
   a mesh cover; and
   a stiffener configured to fix a position of the mesh cover,
   wherein the stiffener comprises a body and an arm extending from the body,
   wherein the arm comprises a bending portion having an internal diameter of about 0.3 mm or more, and
   wherein the arm comprises a first portion extending in a second direction from the body, a second portion extending in a first direction from the first portion, and a third portion extending in an opposite direction of the second direction from the second portion.

2. The mesh assembly of claim 1, wherein the stiffener comprises a plate having a thickness of about 0.2 mm or less.

3. The mesh assembly of claim 1, wherein the arm comprises a folded structure by virtue of the bending portion.

4. The mesh assembly of claim 3, wherein the arm further comprises a contact portion extending in the opposite direction of the second direction from the third portion.

5. The mesh assembly of claim 4, wherein the bending portion is between the first portion and the second portion, and the first portion and the second portion overlap with each other in a third direction crossing the first and second directions.

6. The mesh assembly of claim 5, wherein the bending portion protrudes in an opposite direction of the third direction from the first portion.

7. The mesh assembly of claim 5, wherein the bending portion protrudes in the third direction and from the second portion.

8. The mesh assembly of claim 7, wherein the bending portion is between the second portion and the third portion, and the second portion and the third portion overlap with each other in the third direction.

9. The mesh assembly of claim 8, wherein the bending portion protrudes in an opposite direction of the third direction from the third portion.

10. The mesh assembly of claim 5, wherein the bending portion protrudes in the third direction and from the second portion.

11. The mesh assembly of claim 4, wherein the arm further comprises a step generating portion between the third portion and the contact portion.

12. The mesh assembly of claim 1, wherein the stiffener comprises a protrusion protruding from the body, and the mesh cover covers at least a part of the protrusion.

13. A display module comprising:
a window having an opening;
a display panel at a rear side of the window; and
a mesh assembly at the rear side of the window and overlapping with the opening, the mesh assembly comprising a mesh cover;
a stiffener configured to fix a position of the mesh cover,
wherein the stiffener comprises a body and an arm extending from the body,
wherein the arm comprises a bending portion having an internal diameter of about 0.3 mm or more, and
wherein the arm comprises a first portion extending in a second direction from the body, a second portion extending in a first direction from the first portion, and a third portion extending in an opposite direction of the second direction from the second portion.

14. The display module of claim 13, wherein the stiffener comprises a plate having a thickness of about 0.2 mm or less.

15. The display module of claim 13, wherein the arm comprises a contact portion extending in the opposite direction of the second direction from the third portion.

16. The display module of claim 15, wherein the bending portion is between the first portion and the second portion, and the first portion and the second portion overlap with each other in a third direction crossing the first and second directions.

17. The display module of claim 16, wherein the bending portion protrudes in an opposite direction of the third direction from the first portion.

18. The display module of claim 15, wherein the bending portion is between the second portion and the third portion, and the second portion and the third portion overlap with each other in a third direction.

19. The display module of claim 18, wherein the bending portion protrudes in an opposite direction of the third direction from the third portion.

20. The display module of claim 13, wherein the stiffener comprises a protrusion protruding from the body, the mesh cover covers at least a part of the protrusion, and the protrusion and at least a part of the mesh cover are in the opening.

* * * * *